(12) United States Patent
Maejima

(10) Patent No.: US 7,605,633 B2
(45) Date of Patent: Oct. 20, 2009

(54) LEVEL SHIFT CIRCUIT WHICH IMPROVED THE BLAKE DOWN VOLTAGE

(75) Inventor: Hiroshi Maejima, Milpitas, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 251 days.

(21) Appl. No.: 11/688,666

(22) Filed: Mar. 20, 2007

(65) Prior Publication Data
US 2008/0232168 A1 Sep. 25, 2008

(51) Int. Cl.
*H03L 5/00* (2006.01)
(52) U.S. Cl. .................................. 327/333; 327/306
(58) Field of Classification Search .................. None
See application file for complete search history.

(56) References Cited

U.S. PATENT DOCUMENTS

| | | | | | |
|---|---|---|---|---|---|
| 5,698,993 | A | * | 12/1997 | Chow | 326/81 |
| 5,889,420 | A | * | 3/1999 | Poechmueller | 327/108 |
| 6,177,824 | B1 | * | 1/2001 | Amanai | 327/333 |
| 6,411,554 | B1 | * | 6/2002 | Kawai | 365/189.09 |
| 6,614,283 | B1 | * | 9/2003 | Wright et al. | 327/333 |
| 6,642,769 | B1 | * | 11/2003 | Chang et al. | 327/333 |
| 6,795,328 | B2 | * | 9/2004 | Kato et al. | 365/63 |
| 6,859,074 | B2 | * | 2/2005 | Ajit | 327/108 |
| 6,903,581 | B2 | * | 6/2005 | Clark et al. | 327/112 |
| 7,068,091 | B1 | * | 6/2006 | Kwong | 327/333 |
| 7,102,410 | B2 | * | 9/2006 | Khan et al. | 327/333 |
| 7,116,136 | B2 | * | 10/2006 | Honda et al. | 327/108 |
| 7,176,740 | B2 | * | 2/2007 | Tachibana et al. | 327/333 |
| 2006/0097769 | A1 | * | 5/2006 | Mizukami et al. | 327/333 |
| 2006/0164147 | A1 | * | 7/2006 | Nomura | 327/333 |
| 2006/0232319 | A1 | * | 10/2006 | Osame et al. | 327/333 |
| 2007/0103224 | A1 | | 5/2007 | Namekawa et al. | |
| 2008/0246535 | A1 | | 10/2008 | Namekawa et al. | |

FOREIGN PATENT DOCUMENTS

| | | |
|---|---|---|
| JP | 7-74616 | 3/1995 |
| JP | 10-41806 | 2/1998 |

\* cited by examiner

*Primary Examiner*—Cassandra Cox
(74) *Attorney, Agent, or Firm*—Oblon, Spivak, McClelland, Maier & Neustadt, L.L.P.

(57) ABSTRACT

A gate and the other end of the current path of first and second transistors are cross-connected. A third transistor is inserted to the other end of the current path of the first transistor, and a gate is supplied with a constant voltage, and further, one end of the current path and well are connected. A fourth transistor is inserted to the other end of the current path of the second transistor, and a gate is supplied with a constant voltage, and further, one end of the current path and well are connected. Fifth and sixth transistors are connected to the other end of the current path of the third and fourth transistors, and a gate is complementarily supplied with an input signal. Seventh and eighth transistors are connected to a back gate (well) of the third and fourth transistors, and a gate is complementarily supplied with an output signal.

18 Claims, 4 Drawing Sheets

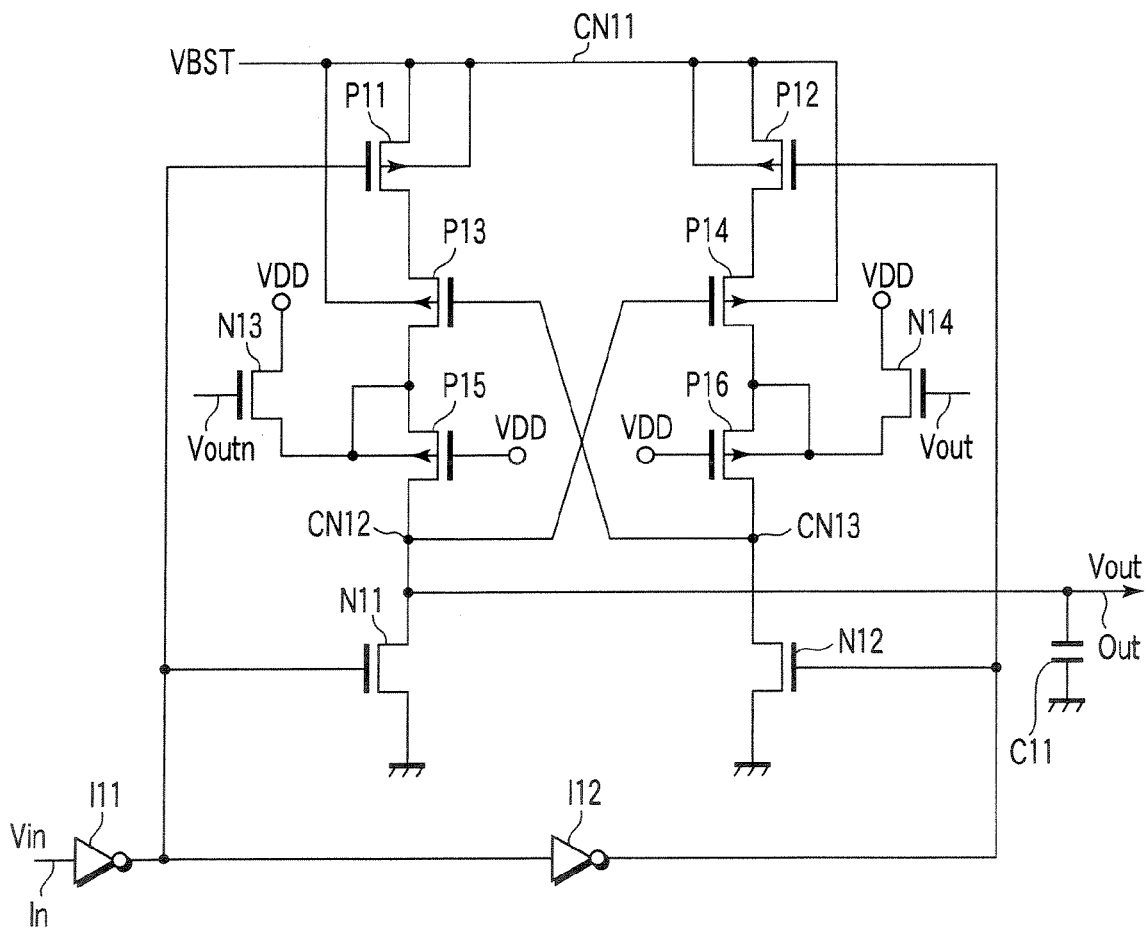
F I G. 1
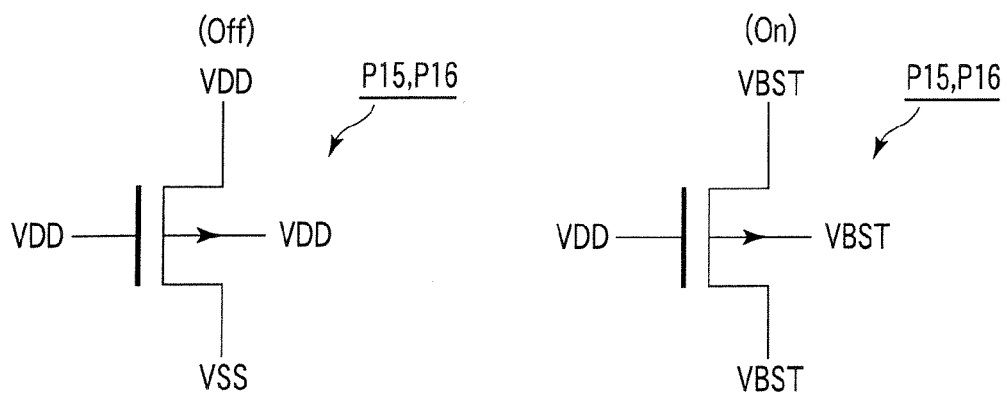
F I G. 2A    F I G. 2B

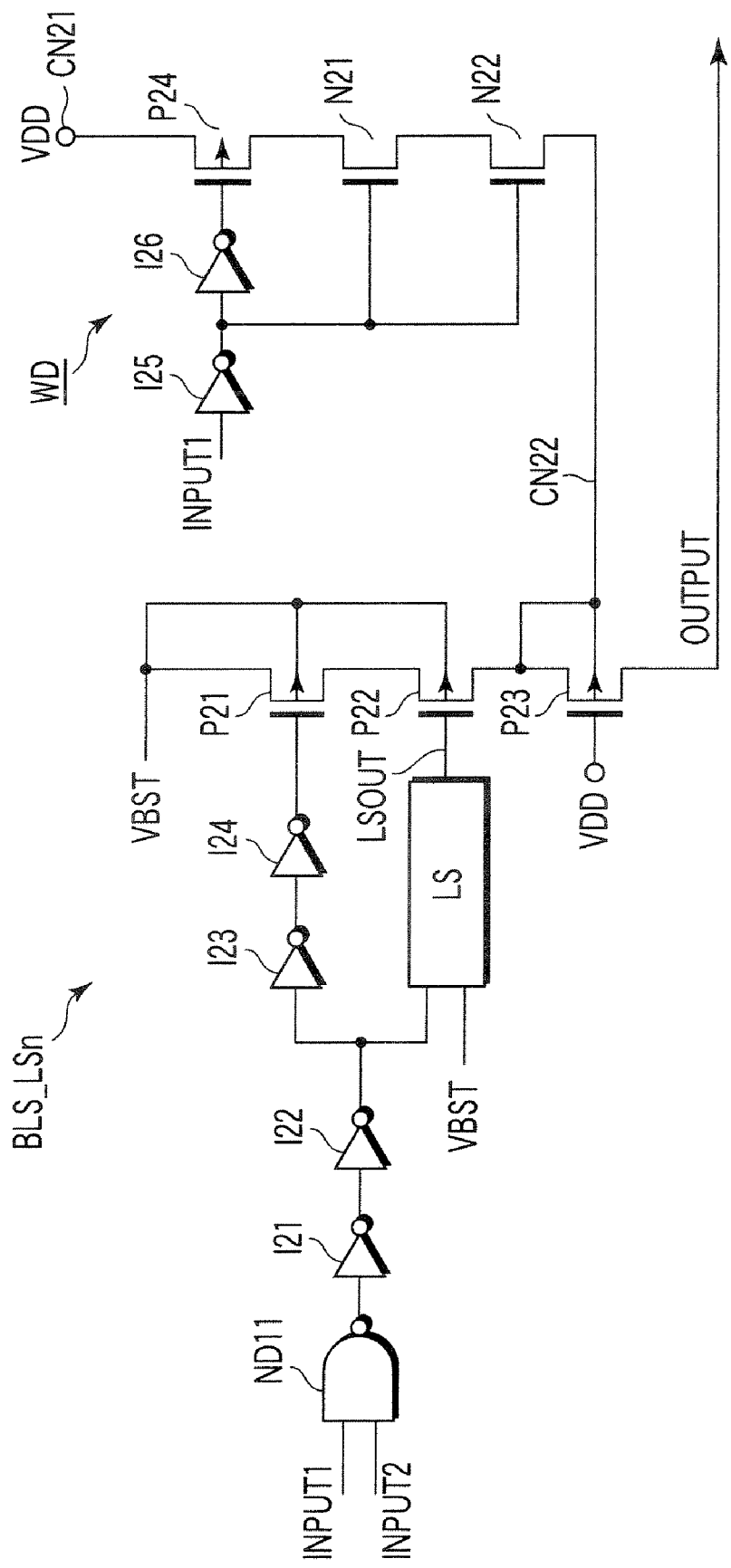
F I G. 5

LEVEL SHIFT CIRCUIT WHICH IMPROVED THE BLAKE DOWN VOLTAGE

BACKGROUND OF THE INVENTION

1. Field of the Invention

The present invention relates to a level shift circuit, which is applied to a non-volatile semiconductor memory device such as a NAND-type flash memory.

2. Description of the Related Art

In a NAND-type flash memory, various voltages are applied to optimize the program characteristic and read characteristic. For example, in a data read operation, voltage VREAD is applied as a read voltage to a word line selected by a row decoder. The gate of a transfer transistor supplied with the read voltage VREAD is supplied with a voltage VREADH higher than the voltage VREAD. Thus, the transfer transistor can transfer the voltage VREAD.

Conventionally, the voltage VREAD has been about 6 V. However, a memory storing multi-level data such as 8 levels and 16 levels in one memory cell has been recently developed. This kind of memory requires about 8 V as a voltage VREAD. Because, the storing the multi-level data requires a level threshold distribution higher than the conventional memory storing binary and four-level data. For this reason, the voltage VREAD must be stepped up according to high level threshold distribution. Moreover, it is effective to improve the voltage VREAD in order to prevent back pattern dependency (i.e., influence of an extent of threshold distribution generated by data written in other non-select memory cell of the same NAND string).

If the voltage VREAD is set as 8 V, a voltage VREADH becomes about 10 V. These voltages VREAD and VREADH are supplied to desired circuits using a cross-coupled level shift circuit. The cross-coupled level shift circuit is a circuit, which has a small layout area and operates at high speed. Thus, the level shift circuit is used for various portions of a NAND-type flash memory. For example, the level shift circuit is used as the following various circuits. One is a driving circuit for driving the foregoing word line of row system and a select gate. Another is a circuit for make control to delay a rise speed when a bit line is charged. Another is a driving circuit of cell source and well.

A level shifter has been developed as this kind of level shift circuit (e.g., see Jpn. Pat. Appln. KOKAI Publications No. H10-41806, and H7-74616). In this level shift circuit, a gate of a P-channel MOS transistor (hereinafter, referred to as a PMOS) serial-connected to a cross-coupled circuit is supplied with a fixed bias. A back gate and a source are connected.

However, it is difficult to use the conventional cross-coupled level shift circuit if the voltage VREAD becomes 10 V. This results from the following reason. A high-voltage P-channel MOS transistor (HVP transistor) forming the level shift circuit has the following problem. Specifically, a voltage which can be applied between drain and source, and between drain and well is 8 V. If a voltage exceeding 8 V is applied, breakdown failure occurs. In order to improve the breakdown voltage of transistors, ion implantation is additionally required, for example. This is a factor of make high a process cost. Therefore, it is desired to provide a level shift circuit, which can prevent a circuit area from increasing, and improve a breakdown voltage.

BRIEF SUMMARY OF THE INVENTION

According to a first aspect of the invention, there is provided a level shift circuit comprising: first conductivity type first and second transistors having a current path whose one end is supplied with a second voltage higher than a first voltage corresponding to a high level of an input signal, each gate of the first and second transistors being cross-connected with the other end of the current path; a first conductivity type third transistor interposed between the other end of the current path of the first transistor and a first connection node connecting the other end of the first transistor and a gate of the second transistor, a gate of the third transistor being supplied with a constant voltage, one end of the current path and a back gate being connected; a first conductivity type fourth transistor interposed between the other end of the current path of the second transistor and a second connection node connecting the other end of the second transistor and a gate of the first transistor, a gate of the fourth transistor being supplied with a constant voltage, one end of the current path and a back gate being connected; second conductivity type fifth and sixth transistors interposed and connected between the first and second connection nodes and ground, each gate of the fifth and sixth transistors being complementarily supplied with the input signal; an output terminal connected to the first connection node; and first conductivity type seventh and eighth transistors connected to each back gate of the third and fourth transistors, the seventh and eighth transistors supplying a constant voltage to each back gate of the third and fourth transistors when the third and fourth transistors are off.

According to a second aspect of the invention, there is provided a level shift circuit comprising: first conductivity type first and second transistors having a current path whose one end is supplied with a second voltage higher than a first voltage corresponding to a high level of an input signal, each gate of the first and second transistors being cross-connected with the other end of the current path; a first conductivity type third transistor interposed between the other end of the current path of the first transistor and a first connection node connecting the other end of the first transistor and a gate of the second transistor, a gate of the third transistor being supplied with a constant voltage, one end of the current path and a back gate being connected; a first conductivity type fourth transistor interposed between the other end of the current path of the second transistor and a second connection node connecting the other end of the second transistor and a gate of the first transistor, a gate of the fourth transistor being supplied with a constant voltage, one end of the current path and a back gate being connected; second conductivity type fifth and sixth transistors interposed and connected between the first and second connection nodes and ground, each gate of the fifth and sixth transistors being complementarily supplied with the input signal; an output terminal connected to the first connection node; and second conductivity type seventh and eighth transistors having one end of a current path and a gate supplied with the constant voltage, the other end of the current path being each back gate of the third and fourth transistors.

According to a third aspect of the invention, there is provided a bias circuit comprising: a first conductivity type first transistor having a current path whose one end is a node supplied with a second voltage higher than a first voltage corresponding to a high level of an input signal, and having a gate supplied with the input signal; a second transistor having a current path whose one end is connected to the other end of the current path of the first transistor; a level shift circuit generating the second voltage, the level shift circuit supplying the second voltage to a gate of the second transistor; a first conductivity type third transistor having a current path whose one end is connected to the other end of the current path of the second transistor, a gate of the third transistor being supplied with a constant voltage, one end of the current path being connected to a back gate while the other end thereof being connected to an output terminal; and a control circuit setting the back gate of the third transistor to a floating state when the second transistor is on according to an output signal of the level shift circuit, and setting the back gate of the third transistor to one of the constant voltage and the floating state when the second transistor is off.

BRIEF DESCRIPTION OF THE SEVERAL VIEWS OF THE DRAWING

FIG. 1 is a circuit diagram showing the configuration of a level shift circuit according to a first embodiment;

FIG. 2A and FIG. 2B are views to explain the relationship of voltage of a transistor shown in FIG. 1

FIG. 5 is a circuit diagram showing a bit line control circuit to which the level shift circuit according the first and second embodiments is applied.

DETAILED DESCRIPTION OF THE INVENTION

Figure 3:
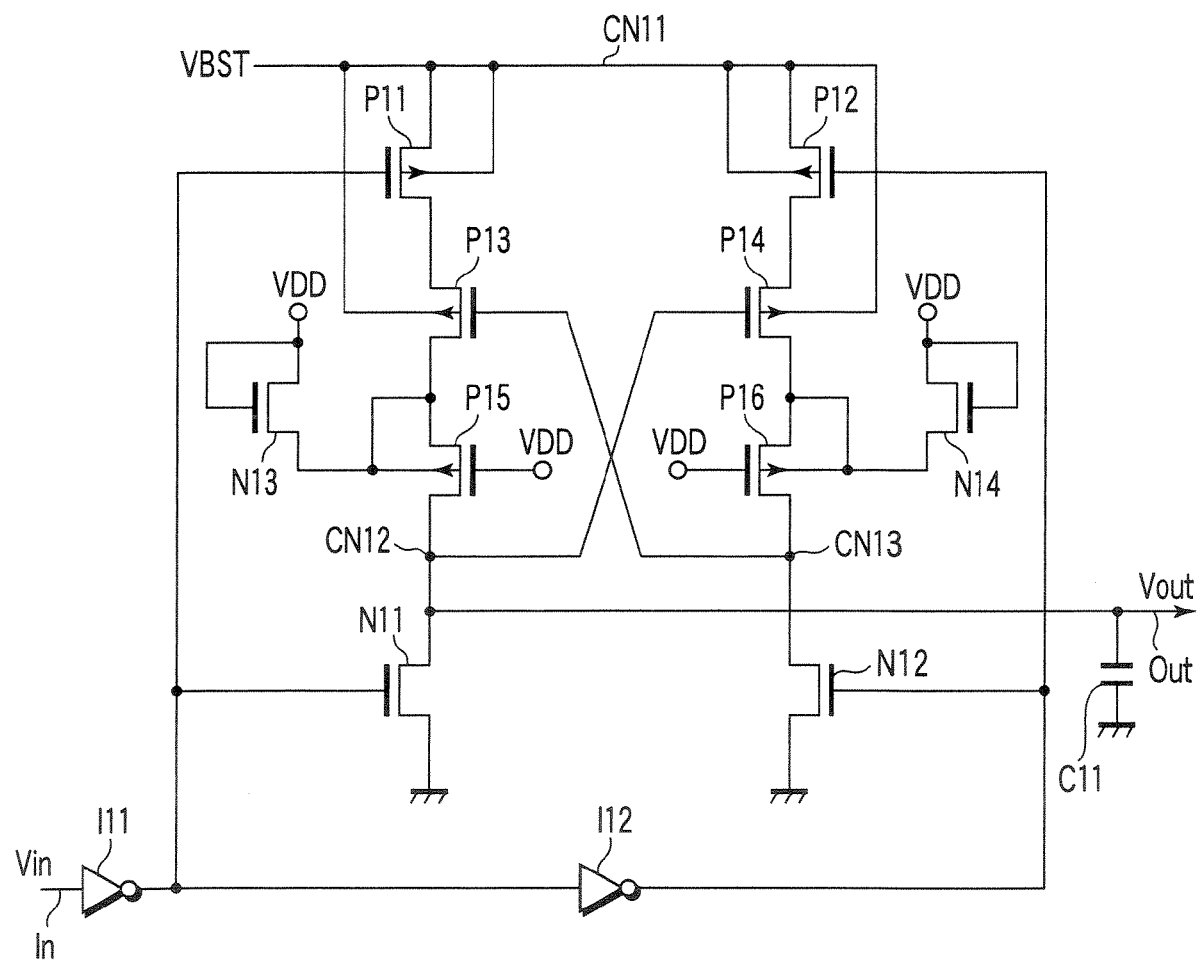
FIG. 3 is a circuit diagram showing the configuration of a level shift circuit according to a second embodiment.

Various embodiments of the present invention will be hereinafter described with reference to the accompanying drawings.

FIG. 1 shows a level shift circuit according to a first embodiment. Sources and back gates (well or substrate) of PMOSs P11 and P12 are connected to connection node CN11. A voltage VBST (=VREADH) by which a power supply voltage VDD (e.g. 2 V) is boosted is supplied to a connection node CN11. The voltage VBST is set higher than a high voltage VDD of an input signal Vin, for example, 8 V+VDD. Drains of PMOS P11 and P12 are each connected to sources of PMOS P13 and P14. Back gates of these PMOSs P13 and P14 are each connected to connection node CN11. Drains of these PMOSs P13 and P14 are each connected to sources and back gates of PMOSs P15 and P16. The gates of these PMOSs P15 and P16 are each supplied with a constant voltage, for example, VDD. Drains of these PMOSs P15 and P16 are each cross-connected to gates of PMOSs P15 and P16. Drains of PMOS P15 and P16 are grounded via N-channel MOS transistors (hereinafter, referred to as NMOS) N11 and N12. PMOS P15 is interposed and connected between the drain of PMOS P13 and the gate of PMOS P14 and connection node CN12 of NMOS N11. PMOS P16 is interposed and connected between the drain of PMOS P14 and the gate of PMOS P13 and connection node CN13 of NMOS N12.

An input terminal IN is supplied with an input signal Vin. Gates of NMOS N11 and PMOS P11 are each supplied with an input signal Vin via an inverter circuit I11. Gates of NMOS N12 and PMOS P12 are each supplied with an output signal of the inverter circuit I11 via an inverter circuit I12. A connection node of NMOS N11 and PMOS P15 is an output terminal OUT of a level shift circuit. A capacitor C1 as output load is connected between the output terminal OUT and ground.

Back gates of PMOSs P15 and P16 are each connected with drains of NMOSs N13 and N14. Sources of NMOSs N13 and N14 are each supplied with a constant voltage, for example, VDD. The gate of NMOS N14 is supplied with an output signal Vout. On the other hand, the gate of NMOS N13 is supplied with an output signal Voutn inverted by connection node CN13.

The foregoing configuration is given, and thereby, if the input signal Vin is low, the output signal of the inverter circuit I11 is high while the output signal of the inverter circuit I12 is low. Thus, PMOS P11 is off, and PMOS P12 is on. PMOS P13 is off, and PMOS P14 is on. NMOS N11 is on, and NMOS N12 is off. For this reason, the output signal Vout of the output terminal OUT becomes low.

In this case, the gate of PMOS P15 is supplied with voltage VDD. However, PMOS P13 is turned off; therefore, PMOS P15 is off. Moreover, the output signal Vout is low. For this reason, NMOS N13 supplied with the inverted output signal Voutn is turned on; therefore, the back gate of PMOS P15 is supplied with voltage VDD.

The gate of NMOS N14 is supplied with a low output signal Vout. For this reason, NMOS N14 is off. The gate of PMOS P16 is supplied with a voltage VDD while the source thereof is supplied with a voltage VBST from PMOS P14, which is on. Thus, PMOS P16 turns on. A voltage of the connection node of PMOS P16 and NMOS N12 is VBST. Thus, PMOS P13 to which the voltage VBST is supplied to a gate is kept off.

On the other hand, when the input signal Vin becomes high, PMOS P11 is turned on, and PMOS P12 is turned off. PMOS P13 is turned on, and PMOS P14 is turned off. PMOS P15 is turned on, and PMOS P16 is turned off. NMOS N11 is turned off, and NMOS N12 is turned on. NMOS N13 is turned off, and NMOS N14 is turned on. Therefore, a high (voltage VBST) output signal Vout is output from the output terminal OUT. As a result, the back gate of PMOS P16, which is off, is supplied with a voltage VDD via NMOS N14. A voltage of the connection node of PMOS P15 and NMOS N11 is voltage VBST. Thus, PMOS P14 to which the voltage VBST is supplied to a gate is kept off.

FIG. 2A shows the voltage relationship of an off state of PMOSs P15 and P16. FIG. 2B shows the voltage relationship of an on state of PMOSs P15 and P16. In an off state shown in FIG. 2A, the gates, sources and back gates of PMOSs P15 and P16 each have voltage VDD. The drains of PMOSs P15 and P16 have ground potential (voltage) VSS. Voltage VDD only is applied to gate insulating films of PMOSs P15 and P16 to the maximum. In an on state shown in FIG. 2B, the gates of PMOSs P15 and P16 are supplied with voltage VDD while the sources, drains and back gates thereof are each supplied with voltage VBST. Thus, voltage of VBST−VSS=8 V is only applied to the gate insulating film to the maximum.

Voltage of VBST−VSS=8 V is applied to the gate insulating films of NMOSs N13 and N14 at the maximum. For this reason, NMOSs N13 and N14 require the same breakdown voltage as PMOSs P11 to P16. However, it is desirable that the size of NMOSs N13 and N14 is as small as possible.

According to the first embodiment, PMOSs P15 and P16 are interposed and connected between drains of PMOSs P13 and P14 having cross-connected gates and drains and connection nodes CN12 and CN13 of the gate. The back gate voltage of these PMOSs P15 and P16 is set to the same as the source voltage. When PMOSs P15 and P16 are turned on, voltage VBST is applied to the back gates of PMOSs P15 and P16. On the other hand, when PMOSs P15 and P16 are turned off, the back gates are supplied with voltage VDD via NMOSs N13 and N14. As a result, a voltage more than 8 V is not applied to a voltage VDS between sources/drains of PMOSs P15 and P16 and a voltage VDB between drains/back gates thereof. Therefore, this serves to prevent an increase of the transistor size, and higher voltage VBST is output as compared with the conventional case.

In addition, voltage VDD is always applied to the gates of PMOSs P15 and P16; therefore, the input signal Vin becomes high. When PMOS P13 is turned on, PMOS P15 directly outputs a high voltage. As a result, high-speed operation is possible.

FIG. 3 shows a level shift circuit according to a second embodiment. In FIG. 3, the same reference numbers are used to designate components identical to FIG. 1, and different components only will be described.

In FIG. 3, gates of NMOSs N13 and N14 are each connected to drains of NMOSs N13 and N14.

According to the foregoing second embodiment, back gates of PMOSs P15 and P16 are always biased to voltage VDD (i.e., VDD−Vth (Vth: threshold voltage of NMOS)) or more. Thus, the configuration is given, and thereby, an increase of the circuit area is prevented, and higher voltage VBST can be used as compared with the conventional case.

Figure 4:
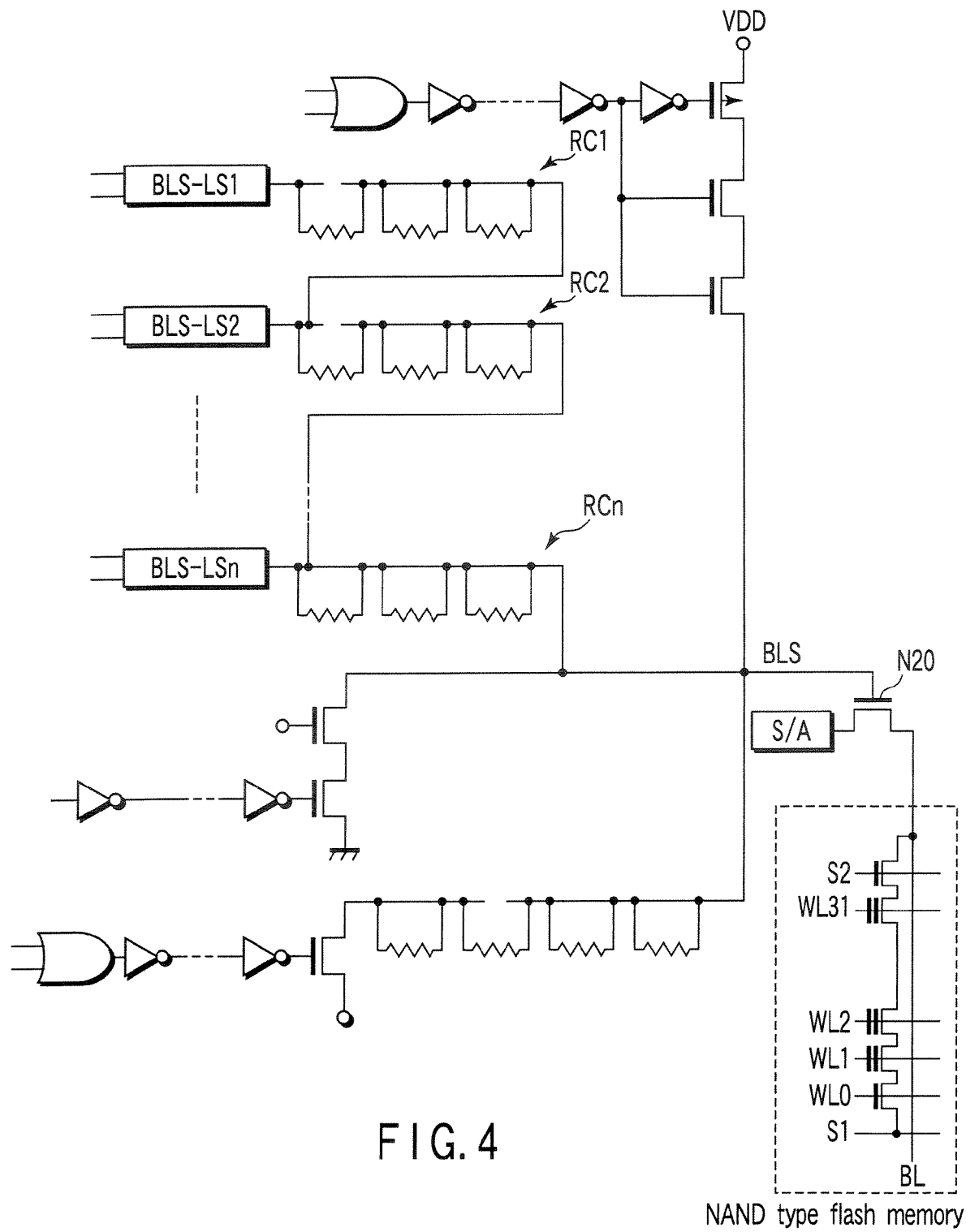
FIG. 4 is a circuit diagram showing the configuration of a bit line control circuit.

FIG. 4 shows one example of a bit line control circuit to which a general level shift circuit is applied. The bit line control circuit is a circuit, which variously delays a rise speed when a bit line of a NAND-type flash memory (not shown) is charged. The bit line control circuit has a plurality of level shift circuits BLS_LS1, BLS_LS2 to BLS_LSn. Part of the configuration of the level shift circuit described in the first and second embodiments is applicable to these level shift circuits BLS_LS1, BLS_LS2 to BLS_LSn. Any one of these level shift circuits BLS_LS1, BLS_LS2 to BLS_LSn is operated in accordance with the following operations, and outputs voltage VBST. The operations includes normal read of NAND-type flash memory, program verify read, erase verify read and normal program. Each output terminal of level shift circuits BLS_LS1, BLS_LS2 to BLS_LSn is connected with resistor circuit RC1, RC2 to RCn having different resistance value. A signal BLS is generated via these resistor circuits RC1, RC2 to RCn. The signal BLS is supplied to the gate of NMOS N20 functioning as a bit line select transistor. One end of NMOS N20 is connected to a sense amplifier (S/A) while the other end thereof is connected to a bit line BL of the NAND-type flash memory.

FIG. 5 shows an example of level shift circuits BLS_LS1, BLS_LS2 to BLS_LSn shown in FIG. 4 using level shift circuit LS shown in the foregoing first and second embodiments. In FIG. 5, PMOSs P21, P22 and P23 are connected in series. The source and back gate of PMOS P21 and the back gate of PMOS P22 is supplied with a voltage VBST boosted from VDD. The back gate of PMOS P23 is connected to the source of PMOS P23 while the drain thereof is connected to an output terminal OUTPUT.

Input signals INPUT1 and INPUT2 are supplied to a NAND circuit ND 11. An output signal of the NAND circuit ND 11 is supplied to the gate of PMOS P21 via inverter circuits I21, I22, I23 and I24. Moreover, an output signal of the inverter circuit I22 is supplied to a level shift circuit LS. The level shift circuit LS is the same as the circuit shown in the first and second embodiments. An output signal of the level shift circuit LS is supplied to the gate of PMOS P22. The gate of PMOS P23 is supplied with a constant voltage, for example, VDD.

Moreover, the back gate of PMOS P23 is connected with a well drive circuit WD. The well drive circuit WD is composed of inverter circuits I25, I26, PMOS P24, NMOSs N21 and N22. PMOS P24, NMOSs N21 and N22 are connected in series between connection node CN21 and connection node CN22 connected to the back gate of PMOS P23. The input signal INPUT1 is supplied to the gate of PMOS P24 via inverter circuits I25 and I26. An output signal of the inverter circuit I25 is supplied to each gate of NMOSs N21 and N22.

In the configuration, the input signal INPUT2 becomes a high while the input signal INPUT1 becomes high. In this case, PMOS P21 is turned on and simultaneously, PMOS P22 is turned on in accordance with the output signal of the level shift circuit LS. Further, PMOS P23 is turned on because the source potential becomes VBST higher than the gate potential VDD. Therefore, voltage VBST is output from the output terminal OUTPUT. The voltage VBST is supplied as a voltage BLS to the gate of the bit line select transistor NMOS N20. In this case, PMOS P24 is turned off because a high input signal INPUT1 is supplied to the gate via Inverter circuits I25 and I26. Moreover, NMOSs N21 and N22 are also turned off because a low signal is supplied to the gates from the inverter circuit I25. Thus, connection node CN21 as the back gate of PMOS P23 is set to source potential VBST. Therefore, the breakdown voltage of PMOS P23 is maintained.

When the input signal INPUT2 is high while the INPUT1 is low, PMOS P21, level shift circuit LS, and PMOSs P22 and P23 turn off. Moreover, PMOS P24 is turned on because a low input signal INPUT1 is supplied to the gate via inverter circuits I25 and I26. NMOSs N21 and N22 are also turned on because a high signal is supplied to the gates from the inverter circuit I25. Thus, connection node CN21 as the back gate and source of PMOS P23 is supplied with voltage VDD.

In the foregoing bit line control circuit, the number of inverter circuits I21 to I24 is changed, and thereby, it is possible to change output timing of the voltage VBST output from the output terminal OUTPUT.

According to the configuration, the well drive circuit WD is stopped to operate when the level shift circuit LS is on while being operated when the level shift circuit LS is off. Thus, when the level shift circuit LS is on, the back gate of PMOS P23 is set to voltage VBST. On the other had, when the level shift circuit LS is off, the back gate of PMOS P23 is set to voltage VDD via the well drive circuit WD. As a result, an increase of the circuit area is prevented, and the breakdown voltage of PMOS P23 is maintained.

The well drive circuit WD supplies voltage VDD to the back gate of PMOS P23 when the level shift circuit LS is off. The present invention is not limited to the foregoing configuration. For example, when the level shift circuit LS is off, the back gate of PMOS P23 may be floating.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A level shift circuit comprising:
   first conductivity type first and second transistors having a current path whose one end is supplied with a second voltage higher than a first voltage corresponding to a high level of an input signal, each gate of the first and second transistors being cross-connected with the other end of the current path;
   a first conductivity type third transistor interposed between the other end of the current path of the first transistor and a first connection node connecting the other end of the first transistor and a gate of the second transistor, a gate of the third transistor being supplied with a constant voltage, one end of the current path and a back gate being connected;

a first conductivity type fourth transistor interposed between the other end of the current path of the second transistor and a second connection node connecting the other end of the second transistor and a gate of the first transistor, a gate of the fourth transistor being supplied with a constant voltage, one end of the current path and a back gate being connected;

second conductivity type fifth and sixth transistors interposed and connected between the first and second connection nodes and ground, each gate of the fifth and sixth transistors being complementarily supplied with the input signal;

an output terminal connected to the first connection node;

first conductivity type seventh and eighth transistors connected to each back gate of the third and fourth transistors, the seventh and eighth transistors supplying a constant voltage to each back gate of the third and fourth transistors when the third and fourth transistors are off; and first conductivity type ninth and tenth transistors connected between one end of the current path of the first and second transistors and a node supplied with the second voltage, the ninth and tenth transistors including gates being complementarily supplied with the input signal.

2. The circuit according to claim 1, wherein each back gate of the first, second, ninth and tenth transistors is supplied with the second voltage.

3. The circuit according to claim 1, wherein the second voltage is a voltage more than read voltage of a NAND-type flash memory.

4. The circuit according to claim 1, wherein the second voltage is a voltage higher by power supply voltage as compared with read voltage of a NAND-type flash memory.

5. The circuit according to claim 1, wherein the constant voltage is the same voltage as the first voltage.

6. The circuit according to claim 1, wherein the first, second, third, fourth, ninth and tenth transistors are a P-channel MOS transistor.

7. A level shift circuit comprising:

first conductivity type first and second transistors having a current path whose one end is supplied with a second voltage higher than a first voltage corresponding to a high level of an input signal, each gate of the first and second transistors being cross-connected with the other end of the current path;

a first conductivity type third transistor interposed between the other end of the current path of the first transistor and a first connection node connecting the other end of the first transistor and a gate of the second transistor, a gate of the third transistor being supplied with a constant voltage, one end of the current path and a back gate being connected;

a first conductivity type fourth transistor interposed between the other end of the current path of the second transistor and a second connection node connecting the other end of the second transistor and a gate of the first transistor, a gate of the fourth transistor being supplied with a constant voltage, one end of the current path and a back gate being connected;

second conductivity type fifth and sixth transistors interposed and connected between the first and second connection nodes and ground, each gate of the fifth and sixth transistors being complementarily supplied with the input signal;

an output terminal connected to the first connection node; and second conductivity type seventh and eighth transistors having one end of a current path and a gate supplied with the constant voltage, the other end of the current path being connected to each back gate of the third and fourth transistors.

8. The circuit according to claim 7, further comprising:

first conductivity type ninth and tenth transistors connected between one end of the current path of the first and second transistors and a node supplied with the second voltage, the ninth and tenth transistors whose gates being complementarily supplied with the input signal.

9. The circuit according to claim 8, wherein each back gate of the first, second, ninth and tenth transistors is supplied with the second voltage.

10. The circuit according to claim 8, wherein the second voltage is a voltage more than read voltage of a NAND-type flash memory.

11. The circuit according to claim 8, wherein the second voltage is a voltage higher by power supply voltage as compared with read voltage of a NAND-type flash memory.

12. The circuit according to claim 7, wherein the constant voltage is the same voltage as the first voltage.

13. The circuit according to claim 9, wherein the first, second, third, fourth, ninth and tenth transistors are a P-channel MOS transistor.

14. A bias circuit comprising:

a first conductivity type first transistor having a current path whose one end is a node supplied with a second voltage higher than a first voltage corresponding to a high level of an input signal, and having a gate supplied with the input signal;

a second transistor having a current path whose one end is connected to the other end of the current path of the first transistor;

a level shift circuit generating the second voltage, the level shift circuit supplying thesecond voltage to a gate of the second transistor;

a first conductivity type third transistor having a current path whose one end is connected to the other end of the current path of the second transistor, a gate of the third transistor being supplied with a constant voltage, one end of the current path being connected to a back gate while the other end thereof being connected to an output terminal; and a control circuit setting the back gate of the third transistor to a floating state when the second transistor is on according to an output signal of the level shift circuit, and setting he back gate of the third transistor to one of the constant voltage and the floating state when the second transistor is off.

15. The circuit according to claim 14, wherein the level shift circuit comprises:

first conductivity type fourth and fifth transistors having a current path whose one end is supplied with the second voltage, the fourth and fifth transistors being configured in a manner that each gate and the other end of the current path are cross-connected;

a first conductivity type sixth transistor interposed between the other end of the current path of the fourth transistor and a first connection node connecting the other end of the current path of the fourth transistor and a gate of the fifth transistor, a gate of the sixth transistor being supplied with a constant voltage, one end of the current path and a back gate being connected;

a first conductivity type seventh transistor interposed between the other end of the current path of the fifth transistor and a second connection node connecting the other end of the current path of the fifth transistor and a gate of the fourth transistor, a gate of the seventh transistor being supplied with a constant voltage, one end of the current path and a back gate being connected;

second conductivity type eighth and ninth transistors interposed between the first and second connection nodes and ground, each gate of the eighth and ninth transistors being complementarily supplied with the input signal;

an output terminal connected to the first connection node; and first conductivity type tenth and eleventh transistors connected to back gates of the sixth and seventh transistors, respectively, each gate of the tenth and eleventh transistors being complementarily supplied with an output signal output from the output terminal.

16. The circuit according to claim 15, wherein the current path of the tenth and eleventh transistor and the back gate are connected.

17. The circuit according to claim 15, wherein the second voltage is a voltage more than read voltage of a NAND-type flash memory.

18. The circuit according to claim 15, wherein the second voltage is a voltage higher by power supply voltage as compared with read voltage of a NAND-type flash memory.

* * * * *